(12) United States Patent
Quijano

(10) Patent No.: US 7,143,478 B2
(45) Date of Patent: Dec. 5, 2006

(54) COMPUTER DISPLAY DEVICE AND METHOD OF OPERATION

(75) Inventor: David Quijano, Magnolia, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 148 days.

(21) Appl. No.: 10/685,627

(22) Filed: Oct. 14, 2003

(65) Prior Publication Data
US 2005/0077439 A1  Apr. 14, 2005

(51) Int. Cl.
A45C 13/26  (2006.01)
A45F 5/10  (2006.01)
H05K 5/00  (2006.01)

(52) U.S. Cl. .......................... 16/445; 16/409; 248/917; 361/683

(58) Field of Classification Search ................. 248/121, 248/460, 462, 463, 150, 917, 922; 16/409, 16/445, 339, 342; 361/683
See application file for complete search history.

(56) References Cited

U.S. PATENT DOCUMENTS

| | | | | |
|---|---|---|---|---|
| 2,897,616 A | * | 8/1959 | Edwards | 38/104 |
| 3,124,266 A | * | 3/1964 | Morgan | 220/4.02 |
| 3,297,118 A | * | 1/1967 | Skyhawk et al. | 190/1 |
| 3,878,964 A | * | 4/1975 | Fogle | 220/756 |
| 4,081,119 A | * | 3/1978 | Messmore | 206/454 |
| 4,424,006 A | * | 1/1984 | Armbruster | 417/234 |
| 4,895,231 A | | 1/1990 | Yamaguchi et al. | |
| 5,100,098 A | * | 3/1992 | Hawkins | 248/291.1 |
| 5,253,753 A | | 10/1993 | Brownfield | |
| 5,347,424 A | * | 9/1994 | Akahane | 361/680 |
| 5,375,076 A | * | 12/1994 | Goodrich et al. | 361/681 |
| 5,396,399 A | * | 3/1995 | Blair et al. | 361/681 |
| 5,632,373 A | * | 5/1997 | Kumar et al. | 206/305 |
| 5,769,369 A | * | 6/1998 | Meinel | 248/176.1 |
| 6,061,104 A | | 5/2000 | Evanicky et al. | |
| 6,189,594 B1 | | 2/2001 | Carter | |
| 6,292,357 B1 | * | 9/2001 | Zamora et al. | 361/680 |
| 6,392,873 B1 | * | 5/2002 | Honda | 361/681 |
| 6,430,038 B1 | * | 8/2002 | Helot et al. | 361/681 |
| 6,636,420 B1 | * | 10/2003 | Nakano et al. | 361/682 |
| 6,807,050 B1 | * | 10/2004 | Whitehorn et al. | 361/681 |

* cited by examiner

Primary Examiner—Anita M. King

(57) ABSTRACT

A display device comprising a display encasement and a handle mechanism pivotally attached to the display encasement.

17 Claims, 6 Drawing Sheets

COMPUTER DISPLAY DEVICE AND METHOD OF OPERATION

BACKGROUND OF THE DISCLOSURE

FIG. 1 depicts a known flat screen type display device 90 which may be for example a liquid crystal display (LCD), light emitting diode (LED), gas plasma or other flat panel type display device. The display device 90 of FIG. 1 comprises a mechanism for assisting a user in relocating the display device 90. In this regard, the display device 90 of FIG. 1 comprises a handle 94. The display handle 94 is typically molded and recessed in a plastic portion of the display 90. The purpose of the handle 94 is to provide a user with a way of grasping the lightweight and portable display device 90 and moving the display device 90 from one place to another.

Although useful for this intended purpose, because such a handle 94 is rigidly located in a position illustrated in FIG. 1, when the display device 90 is in a collapsed state, i.e., the legs 97 and 98, base 96, and the case 92 are in parallel to one another, i.e., in a folded state, it is difficult to grasp the handle to relocate the display device 90, because the handle is covered by other structures such as base 96.

Accordingly, grasping and moving the display device 90, illustrated in FIG. 1, from one place to another can sometimes be difficult. Further, the display device 90 does not provide a mechanism for easily unpacking the display device 90, which is usually shipped in its collapsed state.

SUMMARY OF THE DISCLOSURE

Generally, embodiments of the present disclosure provide a display device handle mechanism and method for using same.

One exemplary embodiment of the present disclosure is a display device comprising a display encasement. Further, the display device comprises a handle mechanism pivotally attached to the display encasement.

An exemplary method of the present disclosure comprises providing a display device pivotally attached to a handle, moving the handle from a first position to a second position in order to open the display device when the display device is in a collapsed state.

DETAILED DESCRIPTION OF THE DISCLOSURE

Figure 1:
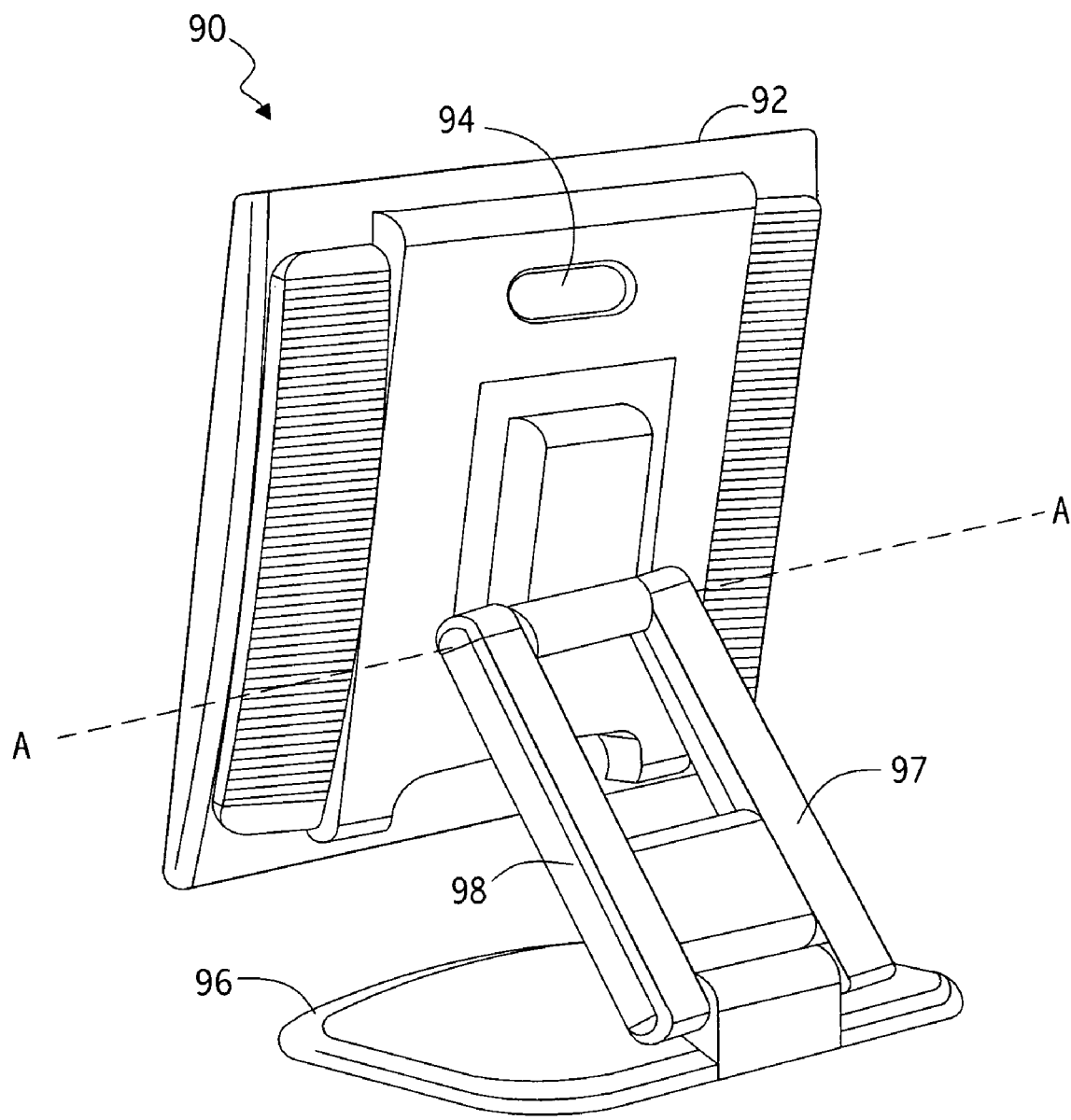
FIG. 1 is a perspective view of a conventional display device.
Figure 2A:
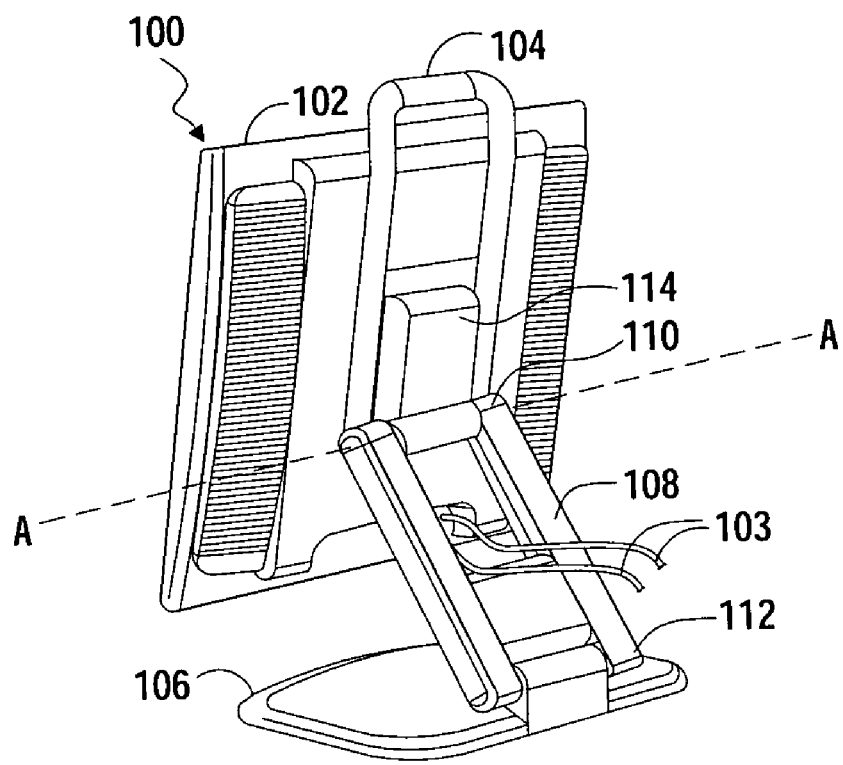
FIG. 2A is a perspective view of another display device illustrating a handle of the display device in an up position.

FIG. 2A illustrates a display device 100 having a display encasement 102, parallel legs 108, and a base structure 106. The display encasement 102 comprises a display screen 101 (shown best in FIG. 4B) and one or more cables 103 that can comprise a power cable for providing power to the display device 100 and/or a communication cable for communicating data from a computing device (not shown) to which the display device 100 may be attached. Further, the display device 100 comprises a handle 104 and a metal plate 114. The metal plate 114 is fixedly mounted relative to the encasement 102. The handle is pivotally attached to the encasement as by pivotal connection to the metal plate 114.

The display encasement 102 is pivotally attached to the legs 108 via an attachment mechanism 110. In addition, the legs 108 are pivotally attached to the base structure 106 via an attachment mechanism 112. The legs 108 are also preferably stabilized by the metal plate 114, which is rigidly affixed to the display encasement 102. In this regard, the metal plate 114 extends between the legs 108 and provides support at the interface of the metal plate 114 with each of the legs 108.

The attachment mechanism 110 and the attachment mechanism 112 preferably each contain a clutch. These clutches in the attachment mechanisms 110 and 112 tend to retain the handle 104 in its various positions. When the display device 100 is in an uncollapsed state, i.e., the display encasement 102 is positioned for viewing by a user, as depicted in FIG. 2A, such handle positions include, for example, an "up position" that refers to a position wherein the handle is adjacent to the encasement 102 (and the encasement is not parallel to the legs 108), a "down position" that refers to a position wherein the handle is parallel with the legs 108, and an "intermediate position" that refers to any position among the range of positions intermediate the up position and the down position. Note that when the display device is in a "collapsed state," described further herein with reference to FIG. 4A and 4B, the encasement 102 is parallel to the legs 108 and the handle 104 is preferably rigidly positioned also parallel to the encasement 102 and the legs 108. Thus, when in the aforedescribed collapsed state, the handle 104 enables a user to relocate the collapsed display device 100 in its collapsed state.

Note that the display device 100 of FIG. 2A shows two substantially parallel legs 108 attaching the display encasement 102 to the base structure 106. However, the number of legs 108 used to attach the display encasement 102 to the base structure 106 could be one or more than two as well. Further note that, although legs 108 are shown in FIG. 2A as narrow elongated members, it is to be understood that the term "leg" as used herein means any rigid structure capable of pivotally supporting a display encasement.

The handle 104 is rotatably attached to the legs 108 via the attachment mechanism 110, which also pivotally attaches the legs 108 to the display encasement 102, as will be described in more detail herein. In FIG. 2A, the handle 104 is shown in an up position and the display device 100 is shown in an open state. The cable 103 may be attached to a power source and/or a computing device during operation when the display device 100 is in the open state as shown.

Figure 2B:
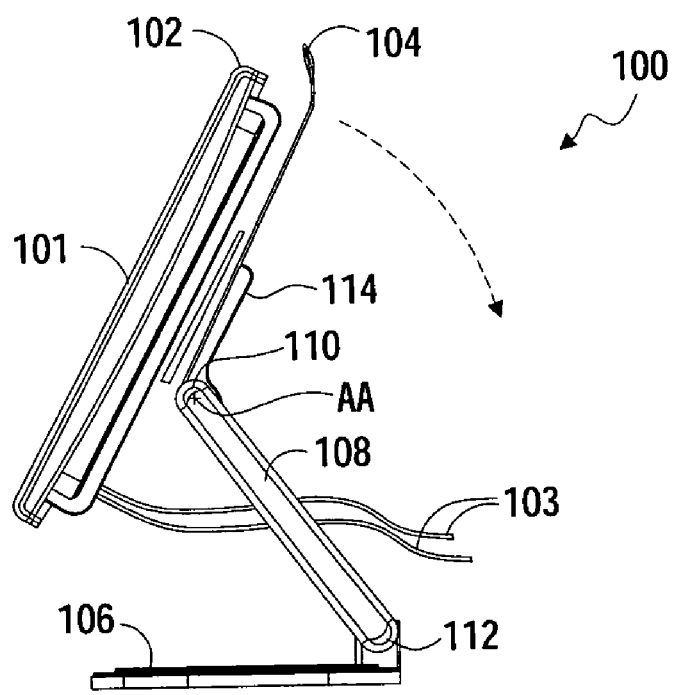
FIG. 2B is a side view of the display device depicted in FIG. 2A.

FIG. 2B illustrates a side view of the display device 100 depicted in FIG. 2A. As described hereinabove, the display device 100 is shown in the open position. In this regard, the display encasement 102 is positioned at an angle with respect to a potential user's line of sight so that the display screen face 101 of the encasement 102 is visible by the user (not shown). The base 106 is positioned and rested on a flat structure, for example a table, and the legs 108 are extended between the base structure 106 and the display encasement 102 for effectuating the operational open position of the display device 100.

The handle 104 is positioned in the up position, as described hereinabove with reference to FIG. 2A. The handle 104 is capable of being pivotally moved manually from the up position shown in FIG. 2B to a down position, described in more detail with reference to FIG. 3B, in the direction of the arrows indicated in the depiction of FIG. 2B toward the cable 103. The handle pivots about a rotation axis AA extending through mechanism 110.

In the up position, the handle 104 serves as a grasping mechanism to enable the user to grasp and move the device 100 when the device 100 is in the uncollapsed state. In this regard, when the handle 104 is in the up position, the user can easily grasp the handle 104, lift the display device 100, and move the display device 100 from one location to another.

Figure 3A:
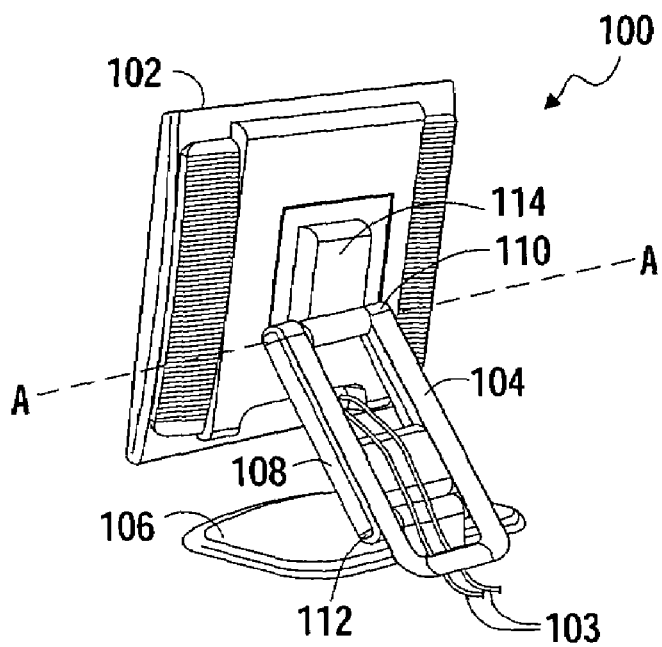
FIG. 3A is a perspective view of the display device depicted in FIG. 2A, wherein the handle is illustrated in a down position.

FIG. 3A illustrates a perspective of the display device 100 wherein the handle 104 is in the down position alluded to herein above. After a user has used the handle 104 to move the display device 100 from one location to another, the user may thereafter move the handle 104 to the down position. While in the down position, the handle 104 is out of the way and possibly the sight of the user. Further, when the handle 104 is positioned in the down position as shown in FIG. 3A, the handle 104 may be used to secure the cable 103 between the handle 104 and the base structure 106. By securing the cable 103, the handle 104 helps to prevent the cable 103 from interfering with operation of the display device 100, with other cables (not shown) and/or with other components that may be used in proximity to the display device 100. Securing the cable 103 may also help to prevent the cable 103 from getting misplaced with reference to the display device 100.

The handle 104 is generally moved from the up position, shown in FIG. 2B, to the down position, shown in FIG. 3A when a user pushes or pulls the handle 104 in the direction of the arrows indicated in FIG. 2A. In so doing the handle 104 rotates about axis AA of the attachment mechanism 110. Note that the attachment mechanism 110 can comprise shoulder screws, bushings, or the like that provide a pivotal attachment to the display encasement 102 and/or provide a pivotal attachment to the handle 104.

Figure 3C:
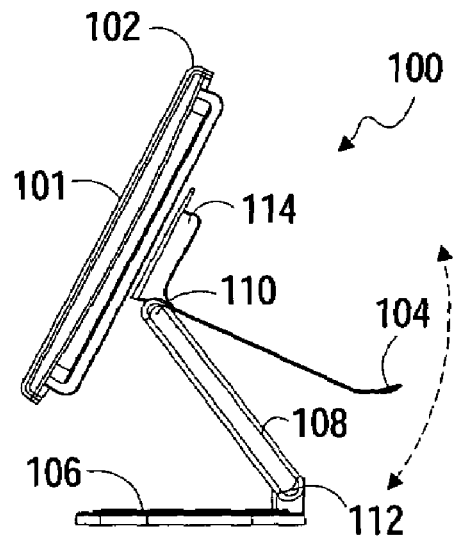
FIG. 3C is a side view of the display device depicted in FIG. 3A, wherein the handle is illustrated in an intermediate position.
Figure 3B:
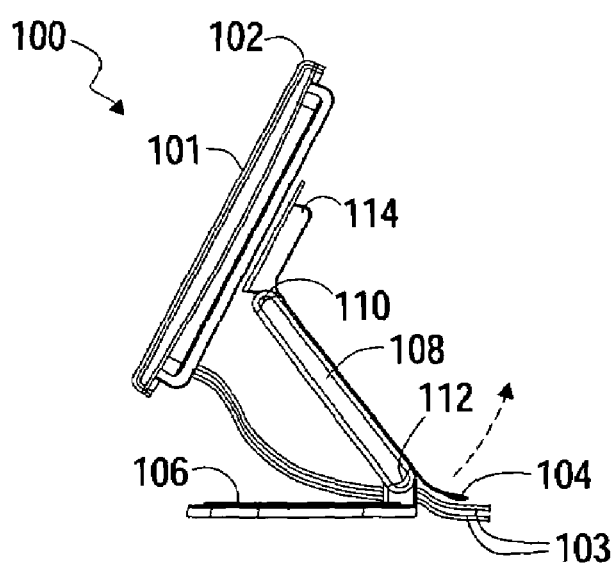
FIG. 3B is a side view of the display device depicted in FIG. 3A.

FIG. 3B is a side view of the display device 100 further illustrating the handle 104 in the down position as described herein with reference to FIG. 3A. As described herein, when the display device 100 is in an operational open state as shown by FIG. 3B, the base structure may be situated on a level surface, e.g., a table or a desk, and a screen 101 of the display encasement 102 may be positioned at an angle with respect to the user's line of sight. In such a state, the legs 108 are extended, and the display encasement 102 may be rotated about the attachment mechanism 110. Note that the display screen 101 and the display encasement 102 preferably form a unitary integrated component.

When the handle 104 is in the down position, as shown in FIG. 3B, the cable 103 may be secured between the handle 104 and the base structure 106. Thus, the cable 103 is prevented from becoming entangled or getting in the way of the user during operation, as described herein. Further, when the handle 104 is in the down position shown, the handle 104 is also out of the way of the user during operation.

However, if during operation, the user (not shown) desires to relocate the display device 100 from one location to another, the user can move the handle 104 from the down position in the direction indicated by the arrows in FIG. 3B. When moving the handle 104 in the direction indicated by such arrows, the handle 104 rotates about the attachment mechanism 110

Thus, when the display device 100 is in the open state, and the handle 104 is in the up position, as illustrated in FIG. 2B, the user can move the handle 104 in a downward direction such that the handle 104 moves closer to the down position. Further, when the display device 100 is in the open state, and the handle 104 is in the down position, as illustrated in FIG. 3B, the user can move the handle 104 in an upward direction such that the handle 104 moves closer to the up position.

FIG. 3C illustrates the handle 104 in an intermediate position (i.e., between the closed and open positions) with reference to the display encasement 102 and the base structure 106. As shown by the arrows in FIG. 3C, the handle 104 can be moved from the intermediate position upward in the direction of the arrows between the display encasement 102 and the handle 104 such that the handle 104 moves closer to the up position. Further, the handle 104 can be moved from the intermediate position downward in the direction of the arrows between the base structure 106 and the handle 104 such that the handle 104 moves closer to the down position.

Figure 4A:
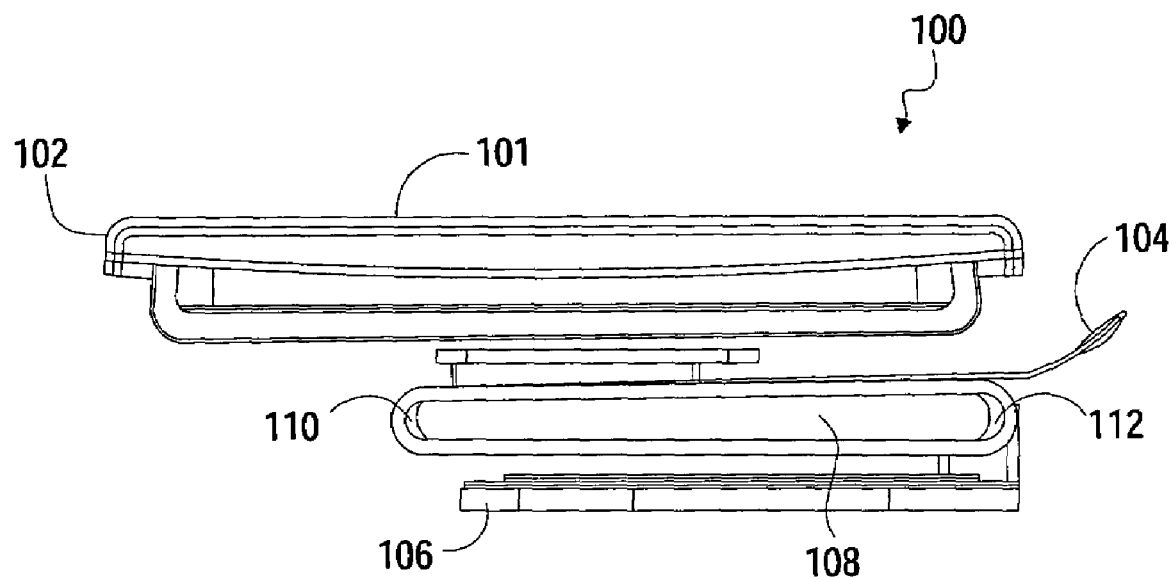
FIG. 4A is a side view of the display device depicted in FIG. 2A, wherein the display device is illustrated in a collapsed state.

FIG. 4A illustrates the display device 100 in a collapsed state. The display device 100 is collapsed by manually moving the display encasement 102 in a downward direction toward the base structure 106. In so moving, the display encasement 102 preferably pivots about the attachment mechanism 110 in a either a clockwise or a counter-clockwise direction. Thus, the display encasement 102 ultimately rests in a position parallel to the legs 108.

Further, as the display encasement 102 is moved in a downward direction toward the legs 108, the legs 108 move in a downward direction toward the base structure 106. As the legs 108 move in this downward direction, they pivot in a direction about the attachment mechanism 112 preferably opposite the direction that the encasement 102 pivots about attachment mechanism 110. Thus, the legs 108 rest in a position parallel to the base structure 106.

When the display device 100 is in the collapsed state as shown in FIG. 4A and as described hereinabove, the handle 104 is also positioned substantially parallel to the display encasement 102, the legs 108, and the base structure 106. The handle 104 is positioned relative to these other components in parallel by the manually actuated downward and pivotal movement of the display encasement 102.

In this regard, the handle 104 protrudes from the collapsed display device 100. The protrusion of the handle 104 is shown in more detail with reference to the top view of the collapsed display device 100 as shown in FIG. 4B.

Figure 4B:
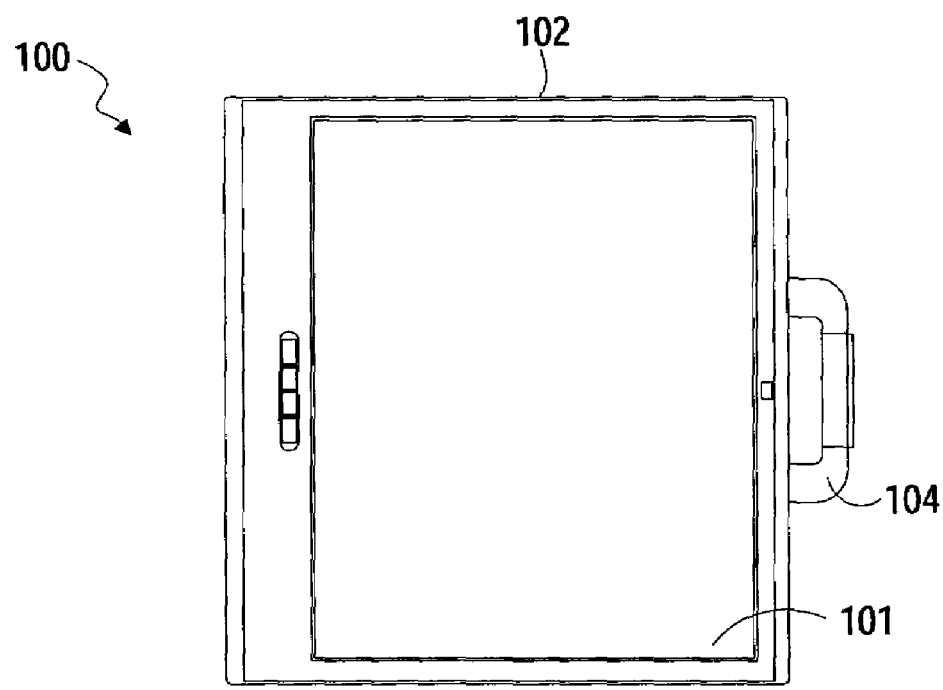
FIG. 4B is a top view of the display device in the collapsed state as depicted in FIG. 4A.

With reference to FIG. 4B, the display encasement 102 is positioned such that it obscures the legs 108, a portion of the handle 104, and the base structure 106. However, a portion of the handle 104 protrudes from the display device 100.

Thus, a user (not shown) can grasp the handle 104 when the display device 100 is in the collapsed position. The user can lift the display device 100, via the handle 104, and carry the display device 100 to another location with ease. Further, when the display device 100 is packaged in a shipping container (not shown), a user may grasp the protruding portion of the handle 104, in order to remove the display device 100 from the shipping container with ease.

Figure 5:
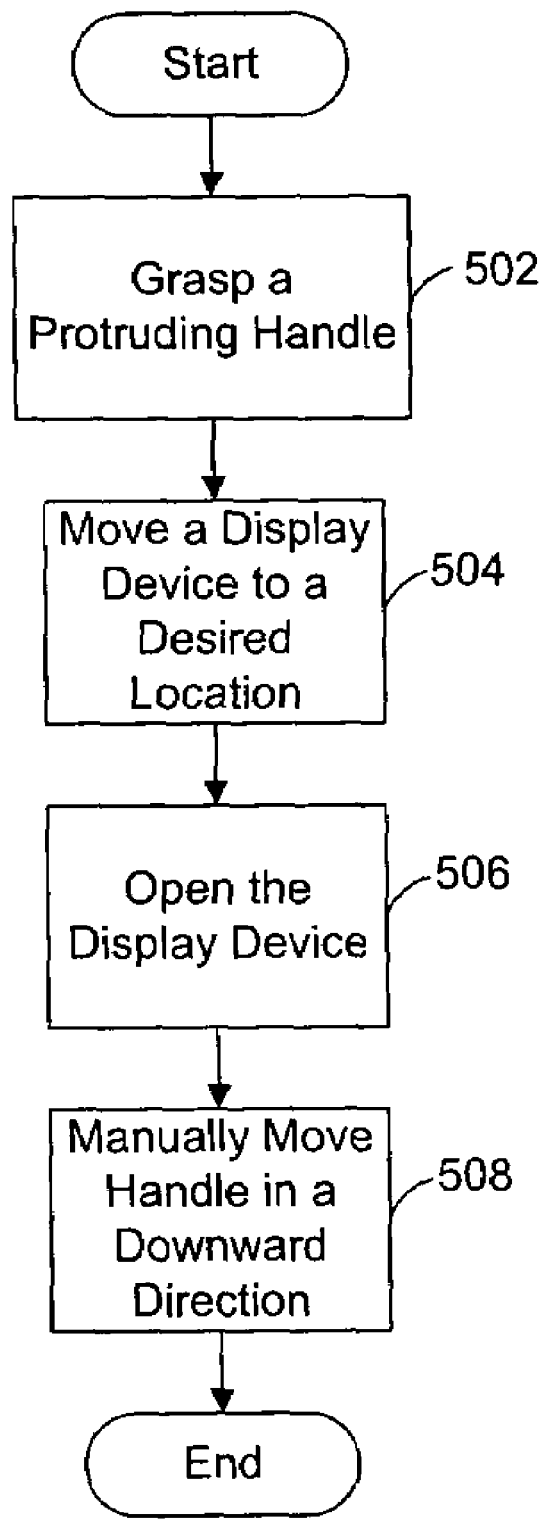
FIG. 5 is a flow chart illustrating a method for using a display device.

FIG. 5 illustrates a method of using the display device 100 of the present disclosure. As shown in FIG. 5, a user grasps a protruding handle 104 of a display device, indicated in step 502. The user can then move the display device to a desired location, as indicated in step 504.

The user initially opens a display device 100 (FIG. 2A), as indicated in step 506. In opening the display device 100, the user can grasp the handle 104 (FIG. 2A) and manually lift the handle 104, which is positioned prior to lifting the handle 104 adjacent to the display encasement 102 (FIG. 2). In lifting the handle 104, the display encasement 102, along with the handle, is moved in an upward direction away from the base 106. In so moving, the display encasement 102 pivots about the attachment mechanism 110 (FIG. 2A), in turn, causing the legs 108 (FIG. 2A) to pivot about attachment mechanism 112 (FIG. 2A). As the display encasement 102 is moved upward causing the display encasement 102 to pivot about mechanism 110 and the legs 108 to pivot about mechanism 112, the legs 108 are extended, and the display screen 101 (FIG. 2A) is inevitably positioned so that a user can view the screen.

Once the display device 100 is in an open state, the user can manually move the handle 104 in a downward direction, as indicated in step 508. In this regard, the user can move the handle 104 in the direction indicated by the arrows in FIG. 2B. Such movement by a user may result in eliminating interference of the protruding handle 104 from the top of the display device 100. Also, once the handle 104 is sufficiently moved downward such that it pinches the cable 104, as depicted in FIG. 2A, movement of the cable is inhibited.

In one embodiment a first clutch device in attachment mechanism 110 that resists rotational movement of display encasement 102 relative legs 108 exerts a greater resistance than a second clutch device in mechanism 110 that resists rotational movement of handle 104. Thus, in this embodiment, handle 104 can be rotated downwardly without causing simultaneous rotational displacement of display encasement 102.

Figure 6:
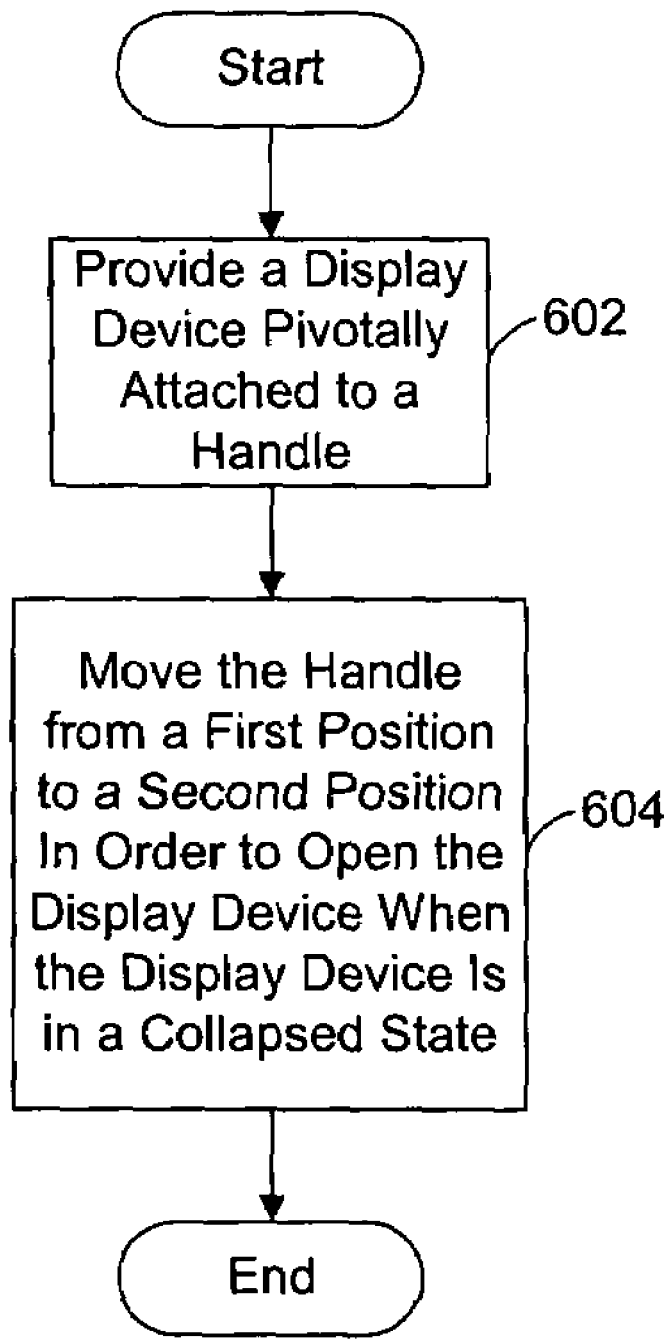
FIG. 6 is a flow chart illustrating another method for using the display device.

FIG. 6 illustrates a method comprising providing a display device 100 (FIG. 2A) pivotally attached to a handle 104 (FIG. 2A), as indicated in step 602, and moving the handle 104 from a first position to a second position in order to open the display device 100 when the display device 100 is in a collapsed state, as indicated in step 604.

What is claimed is:

1. A display device, comprising:
a display encasement; and
a handle pivotally attached to the display encasement, wherein the handle secures a cable extending from the display encasement.

2. The display device of claim 1, wherein the handle moves from a first position to a second position to secure the cable extending from the display encasement.

3. The display device of claim 1, wherein the display encasement is pivotally attached to a first end of a leg.

4. The display device of claim 3, wherein a second end of the leg is pivotally attached to a base structure.

5. The display device of claim 4, wherein the display device collapses to a collapsed state when the leg pivots relative to the display encasement and the base structure.

6. The display device of claim 1, wherein the display encasement is attached to a first leg and the handle pinches the cable against the leg in order to secure the cable.

7. The display device of claim 6, wherein the handle is pivotally attached to the display encasement via a clutch mechanism such that when the handle is securing the cable, the clutch mechanism inhibits movement of the handle thereby ensuring that the cable remains pinched against the leg.

8. A display device, comprising:
a display encasement; and
a handle pivotally attached to the display encasement, wherein the display encasement is pivotally attached to a first end of a leg, wherein a second end of the leg is pivotally attached to a base structure, wherein the display device collapses to a collapsed state when the leg pivots relative to the display encasement and the base structure, and wherein the handle enables a user to open the display device from the collapsed state to an open state.

9. The display device of claim 8, wherein the handle is in a down position when the display device is in the open state such that the handle serves as a guide for a cable extending from the display.

10. A display device, comprising:
a display encasement attached to a base via a leg;
means for collapsing the display device to a collapsed position; and
means for opening the display device from the collapsed position to an open the opening means having a handle pivotally attached to the display encasement, wherein the opening means further comprises means for securing, via the handle, a cable extending from the display encasement.

11. A method, comprising:,
providing a display device pivotally attached to a handle;
moving the handle from a first position to a second position in order to open the display device when the display device is in a collapsed state;
moving the display device from one location to another location via the handle when the handle is in the second position;
moving the handle from a third position to a fourth position; and
securing a cable extending from a display of the display device via the handle when the handle is in the fourth position.

12. A method, comprising:
grasping a protruding handle of a display device;
moving the display device to a desired location;
using the handle to open the display device;
manually moving the handle in a downward direction; and
securing a cable attached to the display device by the handle.

13. A method, comprising:
pivotally attaching a handle to a display encasement; and
securing a cable extending from the display encasement via the handle.

14. The method of claim 13, further comprising pivotally attaching a first end of a leg to the display encasement.

15. The method of claim 14, further comprising pivotally attaching a second end of the leg to a base structure wherein the display device collapses to a collapsed state when the leg pivots relative to the display encasement and the base structure.

16. The method of claim 15, wherein if the display device is in an open state, when the handle is actuated, the device collapses.

17. The method of claim 16, wherein if the display device is in the collapsed state, when the handle is actuated, the device opens.

* * * * *

UNITED STATES PATENT AND TRADEMARK OFFICE
CERTIFICATE OF CORRECTION

PATENT NO. : 7,143,478 B2 Page 1 of 1
APPLICATION NO. : 10/685627
DATED : December 5, 2006
INVENTOR(S) : David Quijano It is certified that error appears in the above-identified patent and that said Letters Patent is hereby corrected as shown below:

In column 6, line 36, in Claim 10, after "open" insert -- position, --.

In column 6, line 41, in Claim 11, delete "comprising:," and insert -- comprising: --, therefor.

Signed and Sealed this

Second Day of December, 2008

JON W. DUDAS
*Director of the United States Patent and Trademark Office*